(12) United States Patent
Nishimura et al.

(10) Patent No.: US 10,141,500 B2
(45) Date of Patent: Nov. 27, 2018

(54) MAGNETOELECTRIC CONVERTING ELEMENT AND MODULE UTILIZING THE SAME

(71) Applicant: ROHM CO., LTD., Kyoto-shi, Kyoto (JP)

(72) Inventors: Isamu Nishimura, Kyoto (JP); Michihiko Mifuji, Kyoto (JP); Satoshi Nakagawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/640,923

(22) Filed: Jul. 3, 2017

(65) Prior Publication Data

US 2018/0013058 A1  Jan. 11, 2018

(30) Foreign Application Priority Data

Jul. 5, 2016 (JP) ................................. 2016-133082
Mar. 22, 2017 (JP) ................................. 2017-055266

(51) Int. Cl.
| | |
|---|---|
| *H01L 43/06* | (2006.01) |
| *H01B 1/02* | (2006.01) |
| *H01L 43/04* | (2006.01) |
| *G01R 33/07* | (2006.01) |
| *H01L 43/12* | (2006.01) |

(Continued)

(52) U.S. Cl.
CPC .......... *H01L 43/06* (2013.01); *G01R 33/0047* (2013.01); *G01R 33/0052* (2013.01); *G01R 33/07* (2013.01); *G01R 33/09* (2013.01); *H01B 1/02* (2013.01); *H01L 43/04* (2013.01);

(Continued)

(58) Field of Classification Search
CPC ..... G01R 15/202; G01R 33/07–33/077; G01R 33/0047; G01R 33/0052; H03B 15/00–15/006; H01L 43/04; H01L 43/14; H01L 2224/05541–2224/05548; H01L 2224/0556–2224/05572; H01L 43/06;

(Continued)

(56) References Cited

U.S. PATENT DOCUMENTS

| | | | | |
|---|---|---|---|---|
| 2009/0001351 A1* | 1/2009 | Shibasaki | ............... | G01R 33/06 257/14 |
| 2012/0139535 A1* | 6/2012 | Watanabe | ............... | G01R 33/07 324/252 |

(Continued)

FOREIGN PATENT DOCUMENTS

JP  2013-207097 A  10/2013

*Primary Examiner* — Selim Ahmed
*Assistant Examiner* — Evan Clinton
(74) *Attorney, Agent, or Firm* — Hamre, Schumann, Mueller & Larson, P.C.

(57) ABSTRACT

A magnetoelectric converting element includes a substrate, a magnetosensitive layer, a first insulating layer, an underlying conductive layer, a second insulating layer, and a terminal conductor. The magnetosensitive layer is formed on the substrate. The first insulating layer is formed with first opening for exposing a part of the magnetosensitive layer. The underlying conductive layer is formed on the exposed part of the magnetosensitive layer. The second insulating layer is formed with a second opening for exposing a part of the underlying conductive layer. The terminal conductor is formed on the exposed part of the underlying conductive layer. The second opening is arranged to be located inside the first opening in plan view.

32 Claims, 9 Drawing Sheets

(51) Int. Cl.
*H01L 43/14* (2006.01)
*G01R 33/00* (2006.01)
*G01R 33/09* (2006.01)

(52) U.S. Cl.
CPC ............ *H01L 43/065* (2013.01); *H01L 43/12* (2013.01); *H01L 43/14* (2013.01)

(58) Field of Classification Search
CPC ....... H01L 43/065; H01L 43/12; H01L 43/00; H01L 43/02
See application file for complete search history.

(56) References Cited

U.S. PATENT DOCUMENTS

| | | | | |
|---|---|---|---|---|
| 2015/0349242 | A1* | 12/2015 | Shiu ........................ | H01L 43/04 257/773 |
| 2017/0040185 | A1* | 2/2017 | Fuwa .................. | H01L 21/4803 |
| 2017/0054071 | A1* | 2/2017 | Takeda .................. | H01L 29/045 |

\* cited by examiner

MAGNETOELECTRIC CONVERTING ELEMENT AND MODULE UTILIZING THE SAME

FIELD

The present disclosure relates to magnetoelectric converting elements and also to modules utilizing magnetoelectric converting elements.

BACKGROUND

Hall-effect elements (simply, "Hall elements" or "Hall devices") are examples of magnetoelectric converting element. Configured to convert magnetic signals (or fields) into electric signals, Hall elements are used in a wide range of fields as current sensors or motor rotation angle sensors. A conventional Hall element may include a substrate, a cross-shaped magnetosensitive component (magnetosensitive layer) provided on the substrate, and terminal conductors in electrical connection with the magnetosensitive component.

To incorporate the conventional Hall element in a magnetoelectric transducer module, the terminal conductors may be bonded to a module substrate by soldering, for example. The problem is that the bonded portions are prone to stress concentration during the manufacture or in use of the magnetoelectric transducer module. A significant stress concentration may degrade the performance of the Hall element, possibly resulting in erroneous output power.

Further, such a magnetoelectric transducer module may suffer the ingress of moisture or Sn contained in the solder into the Hall device in use, for example. As a result, the resistance between the terminal conductors of the Hall device may be altered to improper values to reduce the magnetic sensitivity of the Hall device.

SUMMARY

The present disclosure is prepared in light of the above circumstances and aims to provide magnetoelectric converting elements and and magnetoelectric converting modules capable of preventing stress concentration and hence reduction in performance. The present disclosure also aims to improve the magnetic field sensitivity of the magnetoelectric converting element.

According to a first aspect of the present disclosure, there is provided a magnetoelectric converting element that may be made up of: a substrate; a magnetosensitive layer formed on the substrate; a first insulating layer having a first opening exposing a part of the magnetosensitive layer; an underlying conductive layer formed on the exposed part of the magnetosensitive layer; a second insulating layer having a second opening exposing a part of the underlying conductive layer; and a terminal conductor formed on the exposed part of the underlying conductive layer. The second opening is located inside the first opening in plan view.

According to a second aspect of the present disclosure, there is provided a magnetoelectric converting module that may be made up of: a magnetoelectric converting element according to the first aspect of the disclosure; a module substrate having an obverse surface and a cavity formed in the obverse surface for accommodating the magnetoelectric converting element; a module wiring layer formed on the module substrate; a conductive joint layer that joins the terminal conductor of the magnetoelectric converting element to the module wiring layer; and a sealing resin that fills the cavity and surrounds the magnetoelectric converting element.

Other features and advantages of the present disclosure will be more apparent by reading the detailed description below, with reference to the accompanying drawings.

DRAWINGS

DETAILED DESCRIPTION

Preferred embodiments of the present disclosure will be described below with reference to the drawings.

Figure 1:
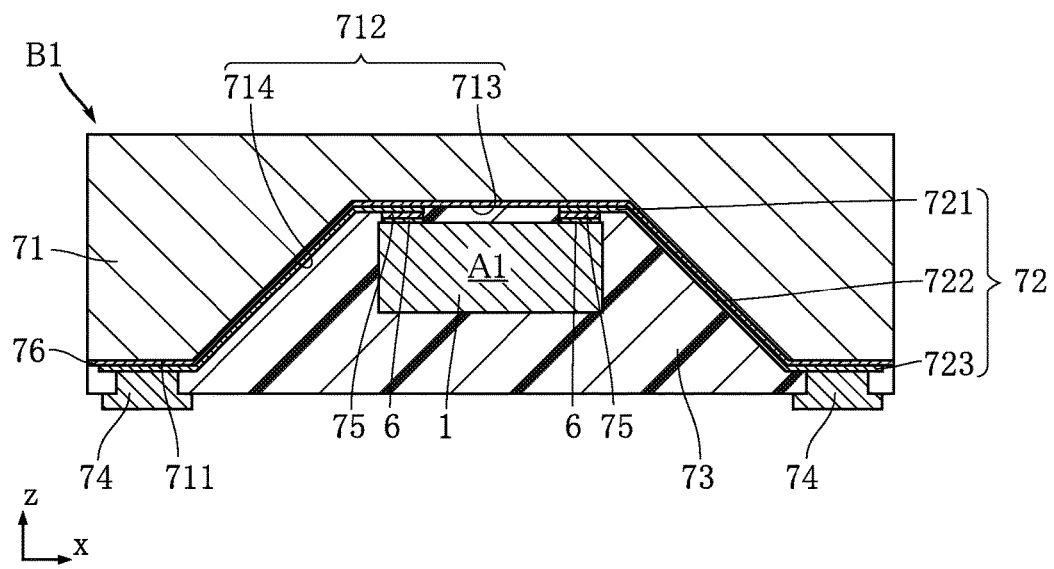
FIG. 1 is a cross-sectional view of a magnetoelectric converting module according to a first embodiment of the present disclosure.

FIGS. 1 to 4 show a magnetoelectric converting element A1 and a magnetoelectric converting module B1 according to a first embodiment of the present disclosure. As shown in FIG. 1, the magnetoelectric converting module B1 includes a magnetoelectric converting element A1, a module substrate 71, a module wiring layer 72, a sealing resin 73 and mounting pads 74. As shown in FIGS. 1 to 4, the magnetoelectric converting element A1 includes a substrate 1, a magnetosensitive layer 2, a first insulating layer 3, a plurality of underlying conductive layer 4, a second insulating layer 5 and a plurality of terminal conductors 6.

The substrate 1 constitutes a base on which the magnetoelectric converting element A1 is fabricated. The substrate 1 may be a Si substrate, a SiC substrate, a single crystal sapphire substrate, a compound semiconductor substrate ora semi-insulating substrate of a relatively high resistance. Compound semiconductors used for the substrate 1 may be InSb, InAs or GaAs, for example. In the present embodiment, the substrate 1 is made of a semi-insulating compound containing GaAs. The substrate 1 may be made to have any suitable shape and dimensions. For example, the substrate 1 may have a generally rectangular shape that measures 0.27 mm by 0.27 mm in plan view.

The magnetosensitive layer 2 contains a compound semiconductor doped with an n-type impurity. Specifically, the magnetosensitive layer 2 may contain InSb, InAs or GaAs as the compound semiconductor and also contain Si as n-type impurity. In one example of this embodiment, the magnetosensitive layer 2 contains GaAs and has a positive temperature coefficient of resistance. The positive temperature coefficient of resistance is defined as an amount of change in the resistance per 1° C. (Celsius). The magnetosensitive layer 2 has a thickness in a range of 2,000 to 15,000 Å (angstrom), for example.

Figure 2:
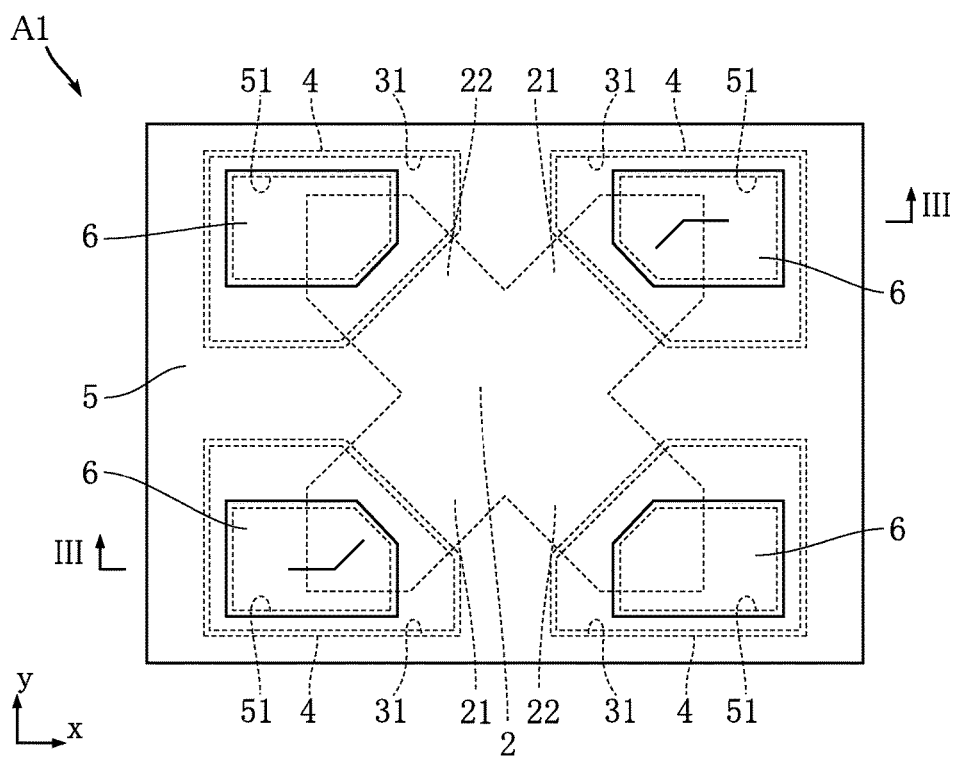
FIG. 2 is a plan view of a magnetoelectric converting element according to the first embodiment.

As shown in FIG. 2, the magnetosensitive layer 2 has a pair of input regions 21 and a pair of output regions 22. In plan view, the input regions 21 extend oppositely outward from the central region of the magnetosensitive layer 2 in directions diagonal to both the x and y directions. Similarly, the output regions 22 extend oppositely outward in directions diagonal to both the x and y directions, such that the output regions 22 are in line symmetry with the input reigns 21. In other words, the pair of input regions 21 and the pair of output regions 22 extend along the diagonal lines of the rectangle substrate 1 in plan view.

The first insulating layer 3 covers apart of the substrate 1 and a part of the magnetosensitive layer 2. The first insulating layer 3 is made of SiN, SiO$_2$ or SiON, for example. In this embodiment, the first insulating layer 3 is made of SiN. The first insulating layer 3 has a thickness in a range of 1,000 to 3,000 Å, for example. The first insulating layer 3 has four first openings 31, each of which exposes a part of the magnetosensitive layer 2. In this embodiment, two of the first openings 31 expose parts of the input regions 21, and the other two first openings 31 expose parts of the output regions 22. In addition, the first openings 31 also expose parts of the substrate 1 not covered by the magnetosensitive layer 2. The first openings 31 are not limited to the configuration that exposes both the substrate 1 and the magnetosensitive layer 2. Alternatively, the first openings 31 may be configured to expose the magnetosensitive layer 2 only.

In this embodiment, as shown in FIG. 2, each first opening 31 defines a polygonal shape having five sides: two sides along the X direction, two sides along the Y direction and one oblique side connecting one X-direction side with one Y-direction side. The oblique side extends across the magnetosensitive layer 2 (the input region 21 or the output region 22).

Figure 4:
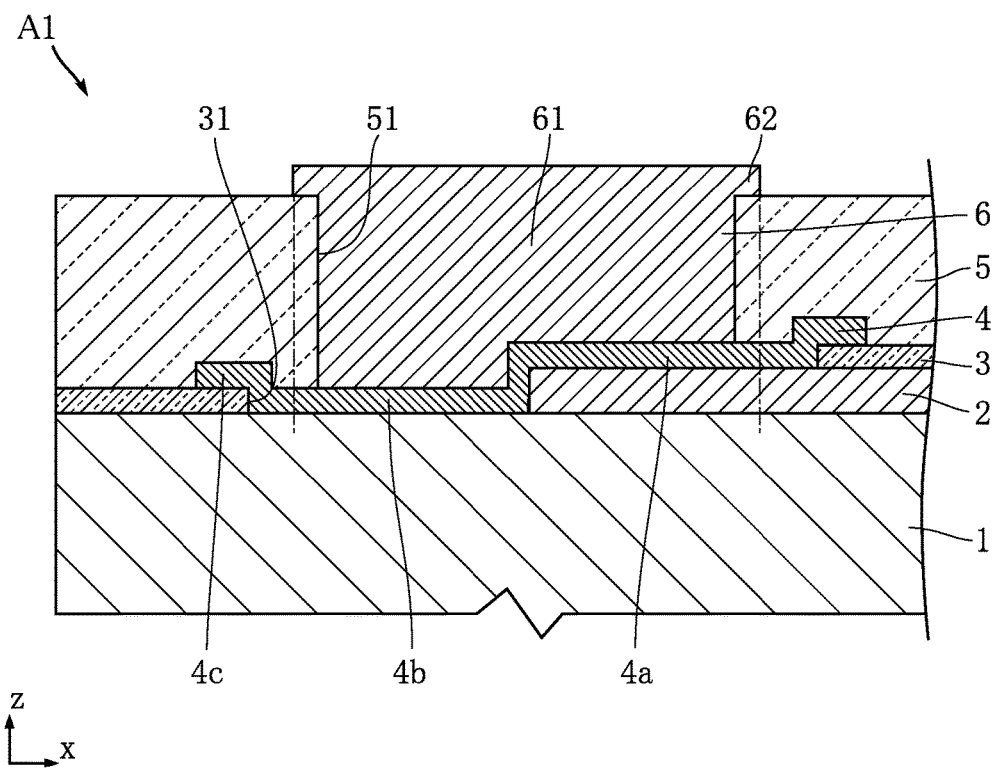
FIG. 4 is an enlarged cross-sectional view taken along line III-III of FIG. 2.

The four underlying conductive layers 4, which are provided to make an ohmic contact with the magnetosensitive layer 2, are stacked on the magnetosensitive layer 2 exposed through the first openings 31. As shown in FIG. 4, each underlying conductive layer 4 of this embodiment includes a magnetosensitive-layer covering portion 4a, a substrate covering portion 4b and an extended portion 4C.

The magnetosensitive-layer covering portion 4a covers the magnetosensitive layer 2. The substrate covering portion 4b covers the part of the substrate 1 exposed through the first opening 31. The extended portion 4c extends beyond the first opening 31 to cover a part of the first insulating layer 3. In the illustrated example, the magnetosensitive-layer covering portion 4a and the substrate covering portion 4b together cover the entirety of the first opening 31. In other words, the entirety of the first opening 31 overlaps with the underlying conductive layer 4 in plan view.

The underlying conductive layers 4 are made of a material suitable for making an ohmic contact with the magnetosensitive layer 2. Examples of such a material include a Au-based alloy containing Ge and Ni. The underlying conductive layers 4 have a thickness in a range of 1,000 to 3,000 Å, for example. As shown in FIG. 2, each underlying conductive layer 4 of this embodiment has a shape substantially similar to the first opening 31 in plan view.

The second insulating layer 5 is made of an insulating material and covers at least a part of the first insulating layer 3 and at least a part of each underlying conductive layer 4. The second insulating layer 5 may be made of a material, such as SiN, SiO$_2$, SiON, polyimide resin or phenolic resin. The following description is directed to the second insulating layer 5 made of SiN. The second insulating layer 5 has a thickness in a range of 0.8 to 5.0 µm, for example, and preferably thicker than the first insulating layer 3.

The second insulating layer 5 has four second openings 51, exposing at least parts of the respective underlying conductive layers 4. The second openings 51 are located inside the respective first openings 31 in plan view. In this embodiment, as shown in FIG. 2, the second openings 51 have a five-sided polygonal shape substantially similar to the shape of the first openings 31. In this embodiment, the entirety of each second opening 51 overlaps with the corresponding one of the underlying conductive layers 4.

The four terminal conductors 6 are provided to electrically connect the magnetoelectric converting element A1 to an external source. The terminal conductors 6 are stacked on the parts of the respective underlying conductive layers 4 exposed through the second openings 51. In one example, the terminal conductors 6 may contain Ni as the main component and may additionally contain Pd and Au. Typically, Pd and Au are contained in the form of separate thin layers stacked on the surface of a layer of Ni as the main component. In one example, each terminal conductor 6 is a laminate of a Ni layer of 0.8 to 5.0 µm, a Pd layer of 0.08 to 0.2 µm, and a Au layer of 0.02 to 0.05 µm.

Figure 3:
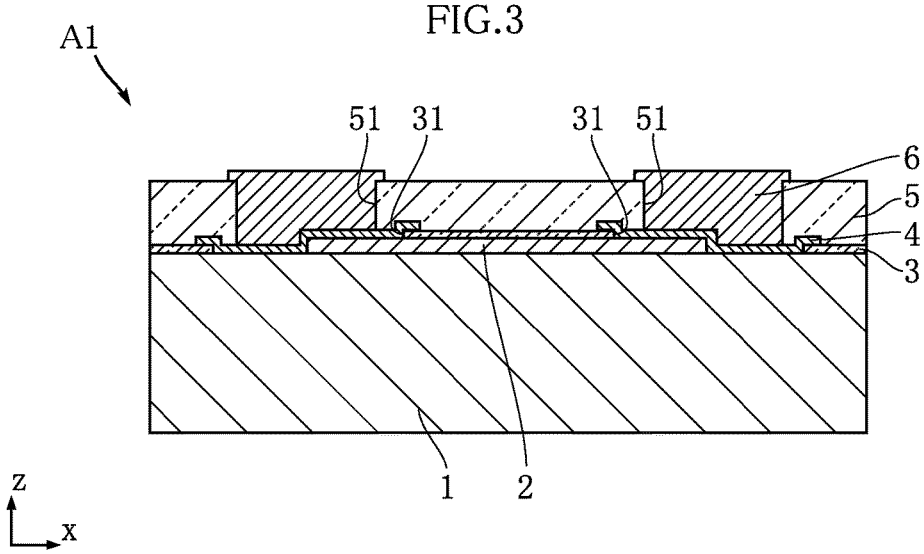
FIG. 3 is a cross-sectional view taken along line III-III of FIG. 2.

As shown in FIGS. 3 and 4, the terminal conductor 6 is thicker than the second insulating layer 5 and extends beyond the second insulating layer 5 in the z direction.

As shown in FIG. 4, each terminal conductor 6 of this embodiment has a filling portion 61 and an extended portion 62. The filling portion 61 fills the second opening 51. In the illustrated example, the filling portion 61 fills the entire space within the second opening 51. The extended portion 62 extends outward beyond the edge of the second opening 51 in plan view. As shown in FIGS. 2 and 4, the entirety of the terminal conductor 6 including the extended portion 62 is located inside both the first opening 31 and the underlying conductive layer 4 in plan view. For clarity, FIG. 4 shows alternate long and short dashed lines extended downward in z direction from the outer edges of the terminal conductor 6 (filling portion 61). The terminal conductors 6 have a five-sided polygonal shape substantially similar to the shape of the second openings 51 in plan view.

As shown in FIG. 1, the magnetoelectric converting module B1 has the magnetoelectric converting element A1 incorporated therein. The module substrate 71 constitutes a base on which the magnetoelectric converting module B1 is fabricated. In this embodiment, the module substrate 71 is made of a single-crystal semiconductor material, which may be Si.

The module substrate 71 has an obverse surface 711 and a cavity 712. The obverse surface 711 is a flat surface facing in the z direction. In this embodiment, the obverse surface 711 is a (100) crystal plane.

The cavity 712 is recessed inward from the obverse surface 711 and accommodates the magnetoelectric converting element A1. The cavity 712 has a bottom surface 713 and lateral surfaces 714. The bottom surface 713 and the obverse surface 711 face the same side in the z direction. The bottom surface 713 of this embodiment is rectangular in plan view. The magnetoelectric converting element A1 is disposed on the bottom surface 713.

The lateral surfaces 714 rise from the bottom surface 713. The lateral surfaces 714 are inclined outwardly at an angle of 55° relative to the z direction. The inclined lateral surfaces 714 are formed due to the obverse surface 711 being the (100) crystal plane. The lateral surfaces 714 are four flat surfaces corresponding to the rectangular bottom surface 713.

In the illustrated example, the obverse surface 711 and the cavity 712 are coated with a module insulating layer 76. The module insulating layer 76 is made of an insulating material, such as $SiO_2$.

The module wiring layer 72 made of an insulating material is disposed on the module substrate 71. The module wiring layer 72 may be a laminate of one or more conductive layers of appropriately selected conductive materials, such as Ti, Ni and Cu.

In the illustrated example, the module wiring layer 72 has a bottom-surface portion 721, a lateral-surface portion 722 and an obverse-surface portion 723.

The bottom-surface portion 721 is located on the bottom surface 713. The bottom-surface portion 721 has four pad portions for bonding of the four terminal conductors 6. The pad portions of the bottom-surface portion 721 are bonded to the terminal conductors 6 via, for example, a conductive joint layer 75. The conductive joint layer 75 maybe made of solder.

The lateral-surface portions 722 connecting the bottom-surface portion 721 and the obverse-surface portion 723 are located on the respective lateral surfaces 714. The obverse-surface portion 723 connected to the bottom-surface portion 721 via the lateral-surface portions 722 is located on the obverse surface 711.

The cavity 712 having such a configuration can be formed by anisotropic KOH etching on the obverse surface 711 of the module substrate 71.

The sealing resin 73 fills the cavity 712 and cover the converting element A1. In the present embodiment, the sealing resin 73 also covers the obverse surface 711. The sealing resin 73 has a plurality of openings exposing the obverse-surface portion 723. Examples of the sealing resin 73 include epoxy resin, phenolic resin, polyimide resin, polybenzoxazole (PBO) resin and silicone resin. As illustrated, the sealing resin 73 fills the gap between the bottom surface 713 of the cavity 712 and the magnetoelectric converting element A1, except where the terminal conductors 6 are present.

The sealing resin 73 has a coefficient of linear expansion that is lower than that of the terminal conductors 6 of the magnetoelectric converting element A1 at temperatures equal to or lower than the transition point of the resin, while being higher than that of the terminal conductors 6 at temperatures higher than the transition point. For example, in the case of the sealing resin 73 made of an epoxy resin, the coefficient of linear expansion ranges from 6 to 7 ppm/K at temperatures equal to or lower than the transition point and from 20 to 28 ppm/K at the temperatures higher than the transition point. In the case of the Ni-based terminal conductor 6, the coefficient of linear expansion is about 14 ppm/K.

The mounting pads 74 are provided in the respective openings in the sealing resin 73 exposing the obverse-surface portion 723. In one example, each mounting pad 74 is a laminate of one or more conductive of appropriately selected materials, such as Ni, Pd and Au. The mounting pads 74 are used to mount the magnetoelectric converting module B1 onto a circuit board (not shown in the figures) or the like.

Figure 5:
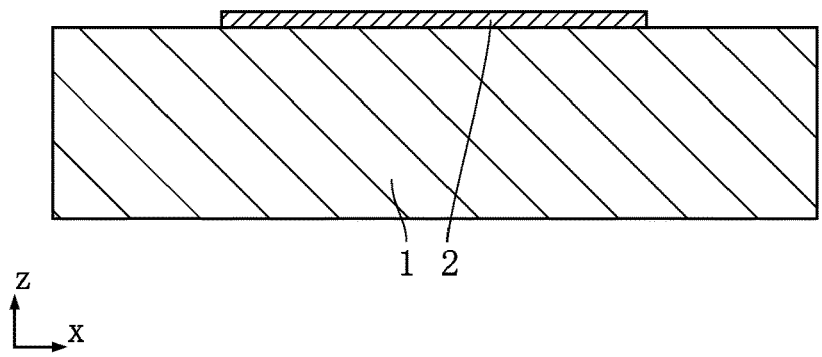
FIG. 5 is a cross-sectional view illustrating a process of manufacturing the magnetoelectric converting element shown in FIG. 2.
Figure 10:
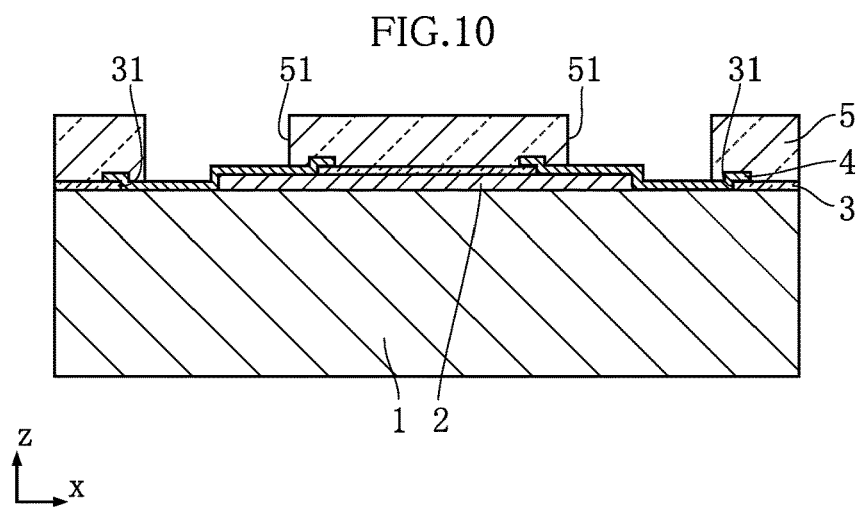
FIG. 10 is a cross-sectional view illustrating a process of manufacturing the magnetoelectric converting element shown in FIG. 2.

The following describes a method of manufacturing a magnetoelectric converting element A1, with reference to FIGS. 5 and 10. Although the description of the method below focuses on components needed for the manufacture of one magnetoelectric converting element A1, the method may be adapted for the manufacture of a plurality of magnetoelectric converting element A1 at a time.

First, referring to FIG. 5, a substrate 1 is prepared. For the manufacture of a plurality of magnetoelectric converting element A1 at a time, a circular GaAs substrate is prepared, which is later cut into a plurality of substrates 1. Next, a conductive layer is formed by epitaxially growing GaAs while being doped with Si as an n-type impurity. The resulting conductive layer is then patterned by e.g., etching to form a magnetosensitive layer 2 having a pair of input regions 21 and a pair of output regions 22.

Figure 6:
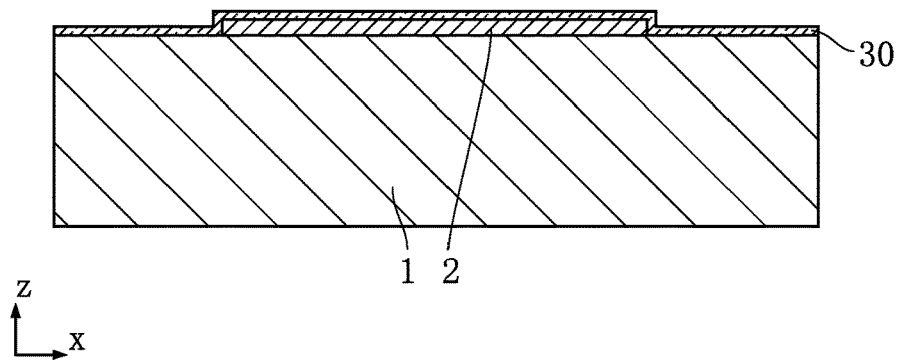
FIG. 6 is a cross-sectional view illustrating a process of manufacturing the magnetoelectric converting element shown in FIG. 2.
Figure 7:
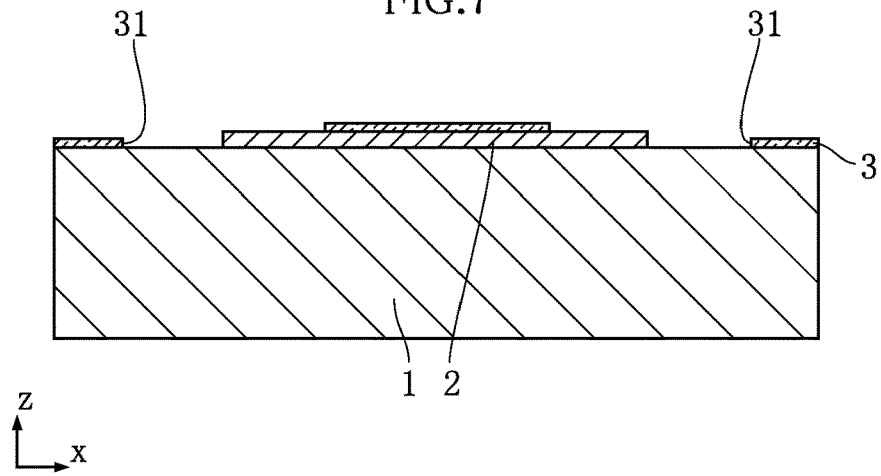
FIG. 7 is a cross-sectional view illustrating a process of manufacturing the magnetoelectric converting element shown in FIG. 2.

Next, as shown in FIG. 6, a first insulating film 30 is formed to cover the substrate 1 and the magnetosensitive layer 2. The first insulating film 30 may be formed by chemical vapor deposition (CVD) of SiN. The first insulating film 30 is then patterned by e.g., etching to form a plurality of openings. As a result, referring to FIG. 7, a first insulating layer 3 having a plurality of first openings 31 is formed.

Figure 8:
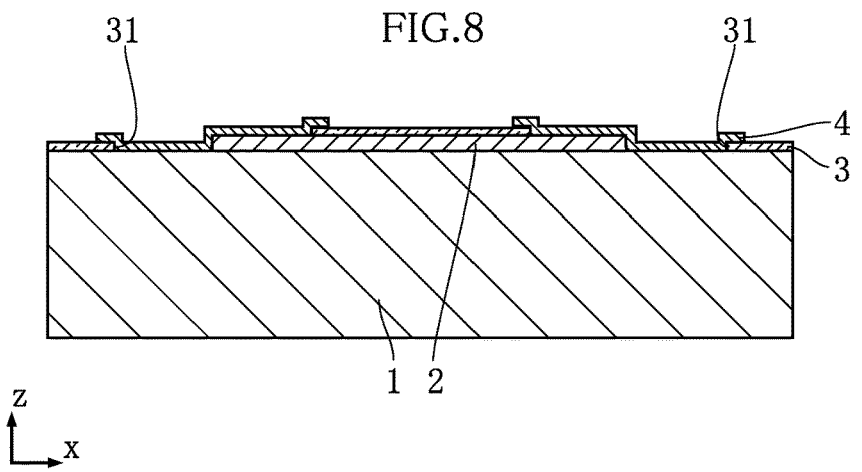
FIG. 8 is a cross-sectional view illustrating a process of manufacturing the magnetoelectric converting element shown in FIG. 2.

Next, as shown in FIG. 8, underlying conductive layers 4 are formed to cover the substrate 1, the magnetosensitive layer 2 and the first insulating layer 3. The underlying conductive layer 4 may be formed by depositing a film of a Au-based alloy containing Ge and Ni by, e.g., CVD or sputtering.

Figure 9:
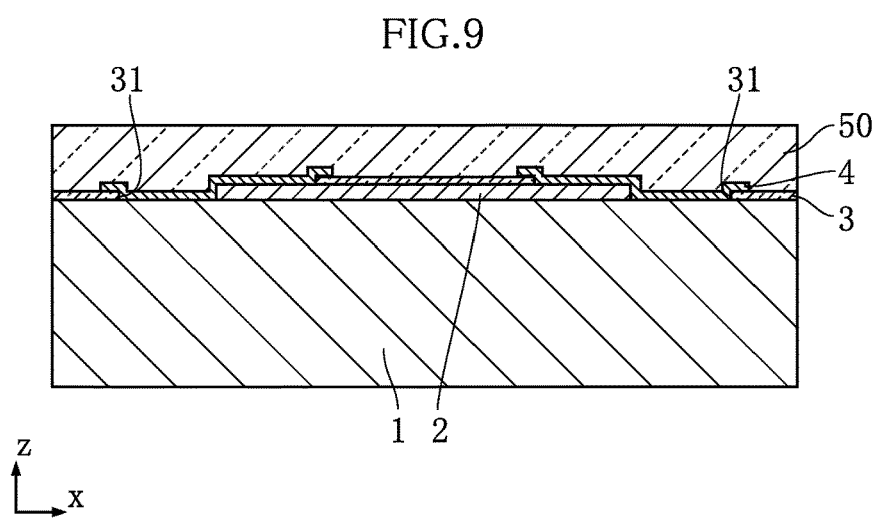
FIG. 9 is a cross-sectional view illustrating a process of manufacturing the magnetoelectric converting element shown in FIG. 2.

Next, as shown in FIG. 9, a second insulating film 50 is formed to cover the first insulating layer 3 and the underlying conductive layers 4. The second insulating film 50 may be formed by e.g., CVD of SiN. Next, the second insulating film 50 is patterned by e.g., etching to form a plurality of openings. As a result, referring to FIG. 10, a second insulating layer 5 having a plurality of second openings 51 is formed.

Then, a plurality of terminal conductors 6 are formed by appropriately laminating layers of Ni, Pd and Au by e.g., plating or CVD. Through the above processes, the magnetoelectric converting element A1 is produced. To form a magnetoelectric converting module B1, the magnetoelectric converting element A1 is mounted on the magnetoelectric converting module B1 by flip-chip mounting to place the magnetoelectric converting element A1 in contact with the bottom-surface portion 721.

The following describes advantages of the magnetoelectric converting element A1 and the magnetoelectric converting module B1.

In the present embodiment, the second openings 51 are located inside the respective first openings 31 in plan view. The second openings 51 are where the terminal conductors 6 are formed. The terminal conductors 6 are subjected to bonding for mounting the magnetoelectric converting element A1 and thus prone to receive external force. Therefore, the boundary between each terminal conductor 6 and the corresponding second opening 51 is where the stress tends to concentrate. However, at a location directly under the boundary between the second opening 51 and the terminal conductor 6, there is no overlap of, for example, the first insulating layer 3 and the underlying conductive layer 4. The present inventors have found that stress applied to a layer overlapping region may affect the magnetosensitive layer 2 and the substrate 1 to reduce the performance of the magnetoelectric converting element, possibly resulting in erroneous output voltage. The magnetoelectric converting element A1 is configured to prevent such stress concentration and the consequent reduction in performance.

The magnetoelectric converting module B1 shown in FIG. 1 includes the sealing resin 73 filling a gap between the obverse surface 711 of the module substrate 71 and the magnetoelectric converting element A1, except where the terminal conductors 6 are present. Under specific temperature conditions, the sealing resin 73 may apply external force to the magnetoelectric converting element A1. Such external force tends to be another cause of stress concentration at the boundary between the terminal conductor 6 and the second opening 51. The magnetoelectric converting module B1 is configured to prevent such stress concentration and the consequent reduction in performance.

In addition, although the extended portion 62 of each terminal conductor 6 extends beyond the corresponding second opening 51, the entirety of the terminal conductor 6 including the extended portion 62 is located inside the first opening 31 in plan view. Such external force tends to be another cause of stress concentration along the peripheral edges of the extended portion 62. However, there is no overlap of, for example, the first insulating layer 3 and the underlying conductive layer 4 at a location directly under the peripheral edges of the extended portion 62. This configuration is effective to prevent stress concentration mentioned above and the consequent reduction in performance.

Each first opening 31 exposes a part of both the magnetosensitive layer 2 and the substrate 1. Each underlying conductive layer 4 has the magnetosensitive-layer covering portion 4a and the substrate covering portion 4b. According to the experimental work by the inventors, the substrate covering portion 4b covering the substrate 1 is effective to stably establish electrical connection, such as an ohmic contact, between the magnetosensitive layer 2 and the terminal conductor 6. Especially, each underlying conductive layer 4 covers the entire parts of the substrate 1 and the magnetosensitive layer 2 exposed thorough the first opening 31, and this configuration is effective to establish a good electrical connection. In addition, the underlying conductive layer 4 is larger in area than the first opening 31 in plan view, and this configuration is effective to reliably cover the entire parts of the substrate 1 and the magnetosensitive layer 2 exposed through the first opening 31. The underlying conductive layer 4 having such dimensions is also effective to preventing an overlap of the first insulating layer 3 and the layer 4 from locating directly under the boundary between the terminal conductor 6 and the second opening 51 as well as under the peripheral edge of the extended portion 62.

In addition, the second openings 51 having a greater depth than the first openings 31 contribute to reducing the influence of the stress concentration on the substrate 1 and the magnetosensitive layer 2.

In an example, the first insulating layer 3 may contain SiN, $SiO_2$ or SiON and the second insulating layer 5 may contain polyimide resin or phenolic resin. In this case, the second insulating layer 5 is made of a softer material than the first insulating layer 3. Such a configuration is expected to further reduce stress concentration.

FIGS. 11 to 19 illustrate other embodiments of the present disclosure. In these figures, the same reference signs are used to denote the same or similar components to those described in the first embodiment.

Figure 11:
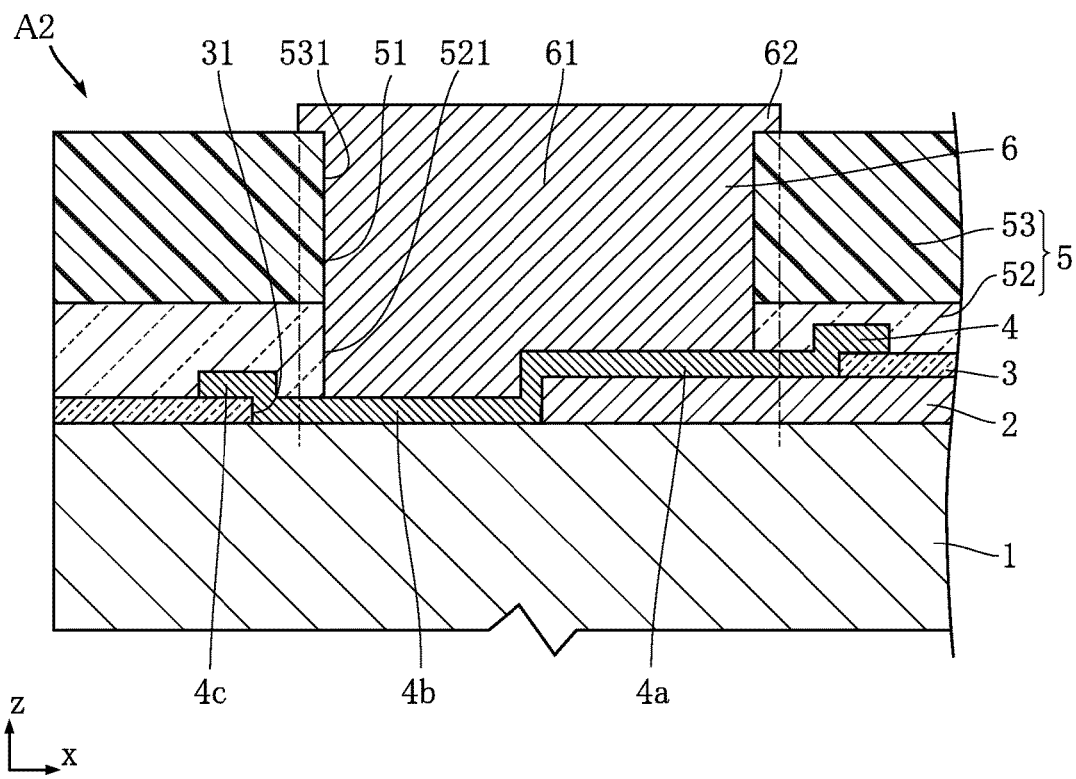
FIG. 11 is an enlarged cross-sectional view of a magnetoelectric converting element according to a second embodiment of the present disclosure.

FIG. 11 shows a magnetoelectric converting element A2 according to a second embodiment of the present disclosure. The magnetoelectric converting element A2 of this embodiment differs from the magnetoelectric converting element A1 mainly in the configuration of the second insulating layer 5.

In the present embodiment, the second insulating layer 5 includes a soft layer 52 and a hard layer 53. The soft layer 52 is made of a softer material than the first insulating layer 3, whereas the hard layer 53 is made of a harder material than the soft layer 52. Any materials satisfying the above relation may be appropriately selectable for the soft layer 52 and the hard layer 53. In one example, the hard layer 53 contains SiN, $SiO_2$ or SiON. Preferably, the hard layer 53 and the first insulating layer 3 are both made of SiN. The soft layer 52 contains polyimide resin or phenolic resin.

In the present embodiment, the hard layer 53 is thicker than the soft layer 52. For example, the hard layer 53 has a thickness in a range of 0.8 to 2.0 μm, whereas the soft layer 52 has a thickness in a range of 2.0 to 3.0 μm.

Similarly to the above embodiment, the second openings 51 of this embodiment expose the underlying conductive layers 4. The soft layer 52 and the hard layer 53 respectively have inner edges 521 and 531 that together define the second openings 51. The inner edges 521 and 531 defining the same second opening 51 coincide with each other in plan view.

Figure 12:
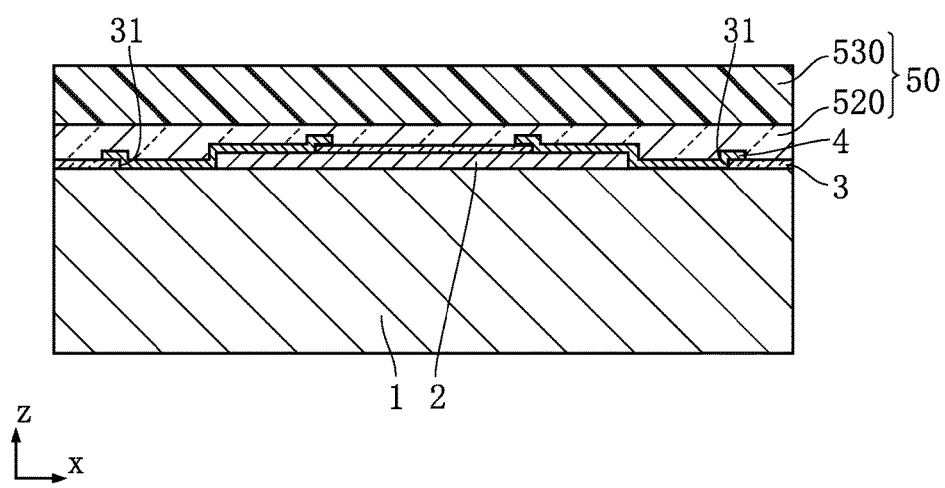
FIG. 12 is a cross-sectional view illustrating a process of manufacturing the magnetoelectric converting element shown in FIG. 11.

In an example of a method of manufacturing the magnetoelectric converting element A2, the process shown in FIG. 8 is followed by processes shown in FIG. 12. Specifically, a soft film 520 is formed to cover the first insulating layer 3 and the underlying conductive layer 4. The soft film 520 may be formed by e.g., CVD of SiN. Subsequently, a hard film 530 is formed to cover the soft film 520. The hard film 530 may be formed by CVD of polyimide resin or phenolic resin. Through the above processes, a second insulating film 50 composed of the soft film 520 and the hard film 530 is formed.

Figure 13:
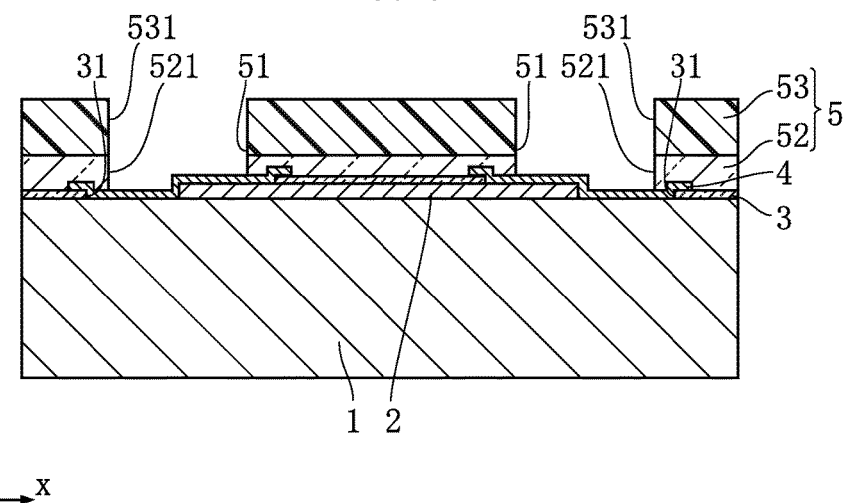
FIG. 13 is a cross-sectional view illustrating a process of manufacturing the magnetoelectric converting element shown in FIG. 11.

Next, the second insulating film 50 is patterned by e.g. etching to form a plurality of second openings. As a result, a second insulating layer 5 having a plurality of second openings 51 is formed, as shown in FIG. 13. Then, similarly to the magnetoelectric converting element A1, a plurality of terminal conductors 6 are formed to complete the magnetoelectric converting element A2.

The magnetoelectric converting element A2 according to the second embodiment is also configured to prevent stress concentration and consequent reduction in performance. In particular, the second insulating layer 5 composed of the soft layer 52 and the hard layer 53 provides the following advantages. First, the soft layer 52 serves to prevent the stress concentration resulting from external force from affecting the substrate 1 and the magnetosensitive layer 2. Second, the hard layer 53, covering the first insulating layer 3 and the underlying conductive layers 4, provides appropriate protection to the layers 3 and 4, and hence to the substrate 1 and the magnetosensitive layer 2, against various external impacts.

The soft layer 52 made of polyimide resin or phenolic resin is effective for mitigating stress concentration. In addition, the soft layer 52 made of the same material, namely SiN, $SiO_2$ or SiON, as the first insulating layer 3 is effective for imparting an appropriate protection strength and also for simplifying the manufacturing procedure.

Figure 14:
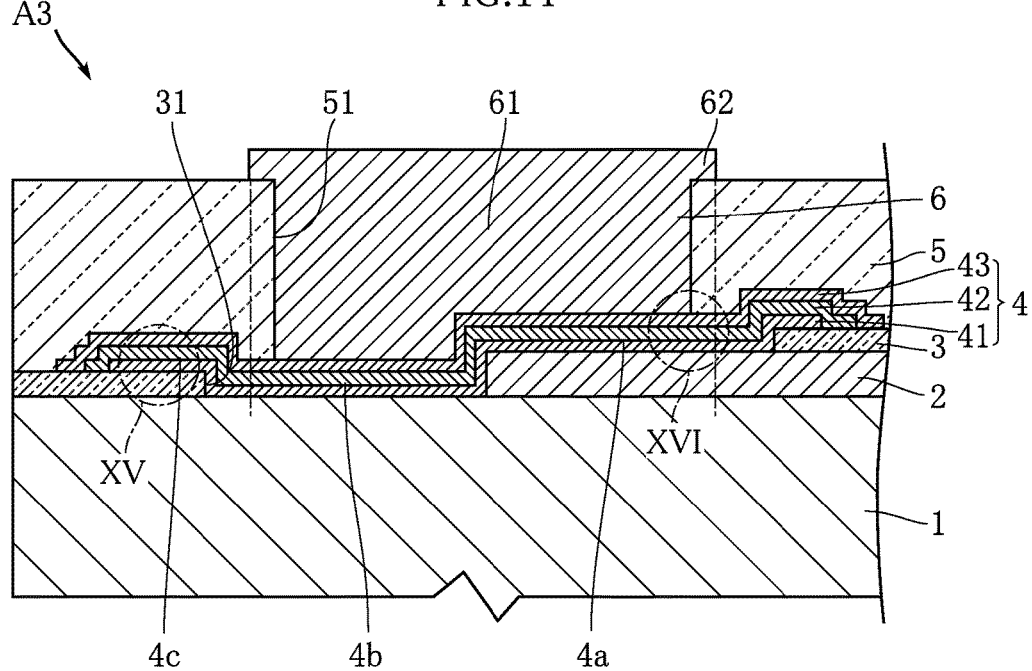
FIG. 14 is an enlarged cross-sectional view of a magnetoelectric converting element according to a third embodiment of the present disclosure.
Figure 15:
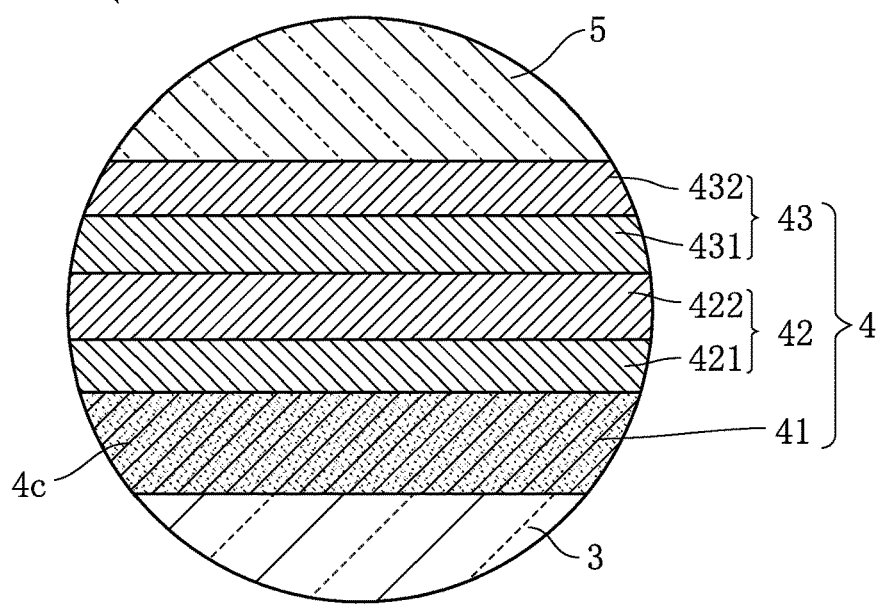
FIG. 15 is an enlarged cross-sectional view of an XV portion of FIG. 14.
Figure 16:
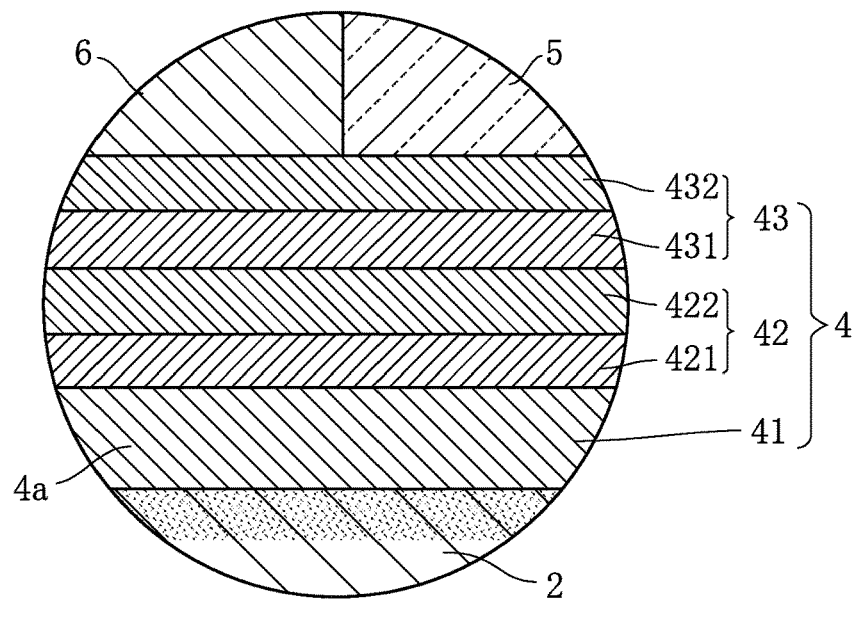
FIG. 16 is an enlarged cross-sectional view of portion XVI in FIG. 14.

FIGS. 14 to 16 illustrate a magnetoelectric converting element A3 according to a third embodiment of the present disclosure. The magnetoelectric converting element A3 of this embodiment differs from the magnetoelectric converting element A1 and A2 in the configuration of the underlying conductive layers 4. Each underlying conductive layer 4 of this embodiment includes a lower ohmic contact layer 41, an interlayer 42 and an upper erosion-resistant layer 43 that are stacked on the substrate 1 or the magnetosensitive layer 2 in the x direction. The ohmic contact layer 41, the interlayer 42 and the erosion-resistant layer 43 may have, without limitation, a thickness in a range of 1,000 to 3,000 Å, for example.

The ohmic contact layer 41 includes a portion in contact with the magnetosensitive layer 2. The ohmic contact layer 41 is provided to make an ohmic contact with the magnetosensitive layer 2. The ohmic contact layer 41 contains Au for making an ohmic contact with the magnetosensitive layer 2, and also contains Ge and Ni added to promote the ohmic contact formation.

FIG. 15 is an enlarged view of XV portion in FIG. 14. As shown in FIG. 15, the extended portion 4c of the underlying conductive layer 4 is in contact with the first insulating layer 3. The ohmic contact layer 41 may be formed, without limitation, using vapor deposition technique. In such a case, the resulting ohmic contact layer 41 contains Au, Ge and Ni in mixture. In FIGS. 14 and 15, the ohmic contact layer 41 is illustrated with hatching for implying the presence of Au, and with small dots for implying the presence of Ge and Ni.

FIG. 16 is an enlarged view of XVI portion in FIG. 14. As shown in FIG. 16, the magnetosensitive-layer covering portion 4a of the underlying conductive layer 4 is in contact with the magnetosensitive layer 2. When the magnetosensitive layer 2 contains GaAs, Ge and Ni in the ohmic contact layer 41 will diffuse into the magnetosensitive layer 2. In FIG. 16, mainly the small dots in the magnetosensitive layer 2 may imply the presence of Ge and Ni. Due to the diffusion of Ge and Ni into the magnetosensitive layer 2, the proportion of Au in the ohmic contact layer 41 becomes higher accordingly.

The interlayer 42 is provided between the ohmic contact layer 41 and the erosion-resistant layer 43 in order to facilitate the plating, for example. Alternatively, the underlying conductive layer 4 may be without the interlayer 42. The interlayer 42 of the present embodiment includes a barrier layer 421 and a main layer 422. The barrier layer 421 made of e.g., Ti is stacked on the ohmic contact layer 41. The main layer 422 made of e.g., Au is stacked on the barrier layer 421. The barrier layer 421 made of Ti serves to resist and stop the etching process when the Au layer is to be etched. The Au-based main layer 422 facilitates the plating of another layer on the main layer 422.

The erosion-resistant layer 43 is an uppermost layer of the underlying conductive layer 4. The erosion-resistant layer 43 is formed at least in contact with the boundary between the second opening 51 in the second insulating layer 5 and the terminal conductor 6. Thus, the erosion-resistant layer 43 overlaps with the boundary between the second insulating layer 5 and the terminal conductor 6, as viewed in the z direction. In the present embodiment, as viewed in the z direction, all the boundaries between the second openings 51 in the second insulating layer 5 and the terminal conductors 6 are overlapped with by the erosion-resistant layers 43, and the erosion-resistant layers 43 cover the entirety of the interlayers 42.

As shown in FIGS. 15 and 16, each erosion-resistant layer 43 of the illustrated example includes a main layer 431 and a plating promoting layer 432. Of these two layers, the main layer 431 is located on a closer side of the ohmic contact layer 41 and, in this embodiment, is in contact with the interlayer 42. The material of the main layer 431 is not specifically limited and may be any suitable material, such as Ni, Ru, Ta or Cu, that is resistant to erosion by moisture or Sn. In this embodiment, the main layer 431 is made of Ni. The plating promoting layer 432 is stacked on the main layer 431 and serves to promote the metal plating for forming the terminal conductors 6. To this end, the plating promoting layer 432 is made of Au, for example. For the purpose of preventing the erosion by moisture or Sn, the erosion-resistant layer 43 may include the main layer 431, and the plating promoting layer 432 may be omitted.

The magnetoelectric converting element A3 according to the third embodiment is also configured to prevent the stress concentration and the consequent reduction in performance. In addition, the third embodiment achieves the following advantage by the erosion-resistant layers 43 in contact with the boundaries between the second openings 51 of the second insulating layer 5 and the terminal conductors 6. Each erosion-resistant layer 43 includes the main layer 431 made of e.g., Ni. Generally, a module similar to the magnetoelectric converting module B1 described above is associated with the risk that ambient moisture or Sn in the solder bonded to the terminal conductors 6 enters the module through the boundaries between the second openings 51 in the second insulating layer 5 and the terminal conductors 6. Especially, the ingress of Sn may cause the erosion of layers though repeated substitution for Au. If the erosion reaches the ohmic contact layer 41 of an underlying conductive layer 4, the ohmic contact between the underlying conductive layer 4 and the magnetosensitive layer 2 will be broken. Consequently, the contact resistance between the underlying conductive layer 4 and the magnetosensitive layer 2 may increase, leading to a potential difference between the terminal conductors 6 when no magnetic field is applied to the magnetosensitive layer 2 and thus no potential difference should be present between the terminal conductors 6. However, the Ni-based main layer 431 of this embodiment prevents the ingress of moisture and Sn and thus prevents the above-described erosion. Therefore, this embodiment can improve the magnetic field sensitivity of the magnetoelectric converting element A3.

The erosion-resistant layer 43 completely covers the ohmic contact layer 41 and the interlayer 42, as viewed in the z direction. Generally, erosion resulting from the Sn substitution for Au may progress in the x and y direction in addition to the z direction. However, such erosion is expected to be stopped more reliably, by the erosion-resistant layer 43 that completely covers the ohmic contact layer 41 and the interlayer 42.

The plating promoting layer 432 included in the erosion-resistant layer 43 facilitates the forming of the terminal conductor 6 by plating. The interlayer 42 facilitates the forming of the erosion-resistant layer 43.

Since Ge and Ni initially contained in the ohmic contact layer 41 are diffused into the magnetosensitive layer 2, the resulting ohmic contact layer 41 containing Au can more reliably establish an ohmic contact with the magnetosensitive layer 2 containing GaAs.

Figure 17:
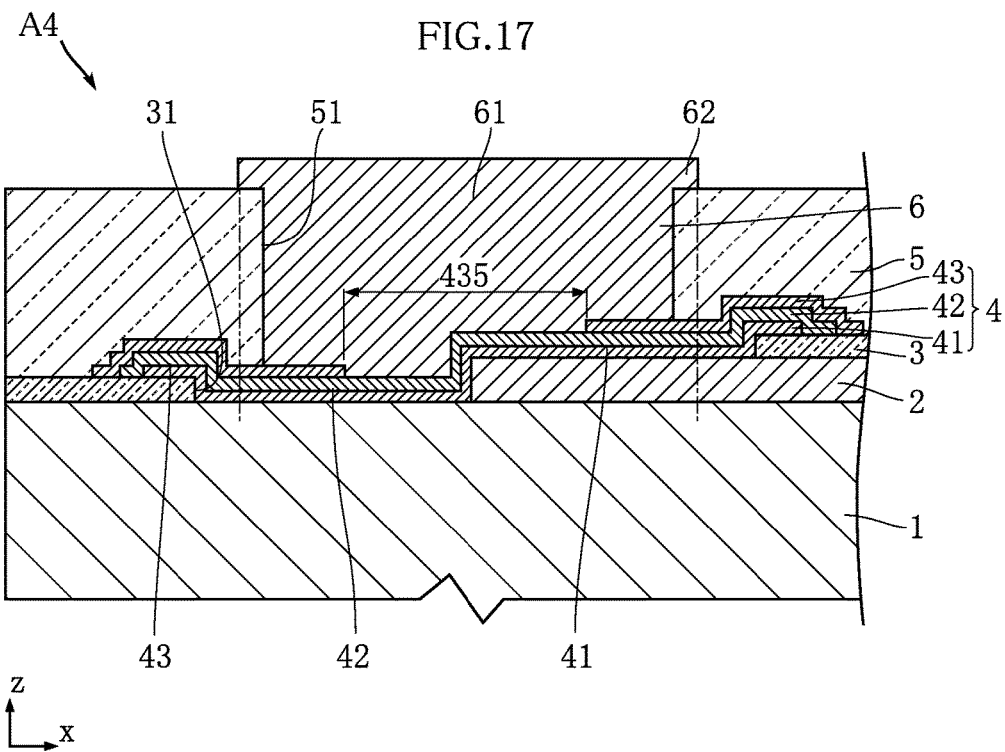
FIG. 17 is an enlarged cross-sectional view of a magnetoelectric converting element according to a fourth embodiment of the present disclosure.

FIG. 17 shows a magnetoelectric converting element A4 according to a fourth embodiment of the present disclosure. The magnetoelectric converting element A4 differs from the magnetoelectric converting element A3 described above in the configuration of the erosion-resistant layers 43. Each erosion-resistant layer 43 according this embodiment has an opening 435 that extends through the erosion-resistant layer 43 in the thickness direction.

The opening 435 is located inside the boundary between the second opening 51 in the second insulating layer 5 and the terminal conductor 6, as viewed in the z direction. Hence, in a region inside the opening 435, the interlayer 42 is in contact with the terminal conductor 6. In contrast, in a region under the boundary between the second opening 51 in the second insulating layer 5 and the terminal conductor 6, the erosion-resistant layer 43 is located between the terminal conductor 6 and the interlayer 42.

The magnetoelectric converting element A4 according to the fourth embodiment is also configured to prevent stress concentration and the consequent reduction in performance. In addition, this embodiment can prevent the ingress of moisture and Sn through the boundaries between the second openings 51 in the second insulating layer 5 and the terminal conductors 6. Therefore, this embodiment can improve the magnetic field sensitivity of the magnetoelectric converting element A4.

Figure 18:
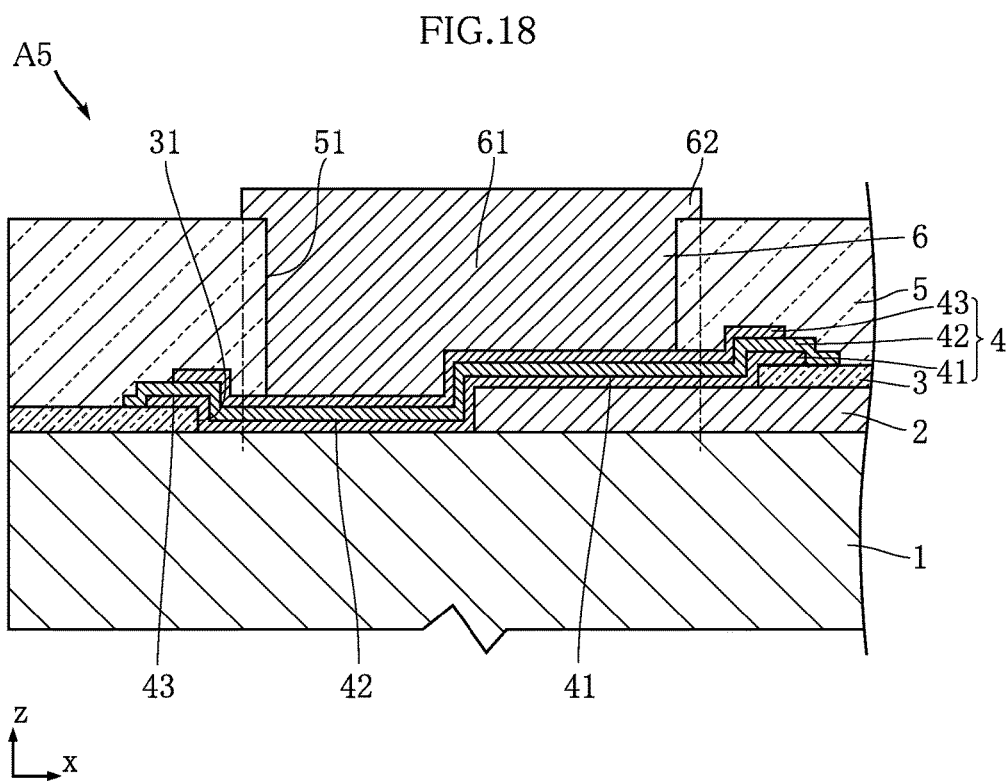
FIG. 18 is an enlarged cross-sectional view of a magnetoelectric converting element according to a fifth embodiment of the present disclosure.

FIG. 18 shows a magnetoelectric converting element A5 according to a fifth embodiment of the present disclosure. The magnetoelectric converting element A5 of this embodiment differs from the magnetoelectric converting element A3 and A4 described above in the configuration of the erosion-resistant layers 43.

Each erosion-resistant layer 43 of this embodiment does not cover the edges of the ohmic contact layer 41 and the interlayer 42 located outside the boundary between the second opening 51 and the terminal conductor 6. Thus, the edges of the interlayer 42 are in contact with the second insulating layer 5.

The magnetoelectric converting element A5 according to the fifth embodiment is also configured to prevent stress concentration and the consequent reduction in performance. In addition, this embodiment can prevent the ingress of moisture and Sn through the boundaries between the second openings 51 in the second insulating layer 5 and the terminal conductors 6. Therefore, this embodiment can improve the magnetic field sensitivity of the magnetoelectric converting element A5.

The configurations of the erosion-resistant layers 43 in the magnetoelectric converting element A4 and A5 maybe employed separately or in combination.

Figure 19:
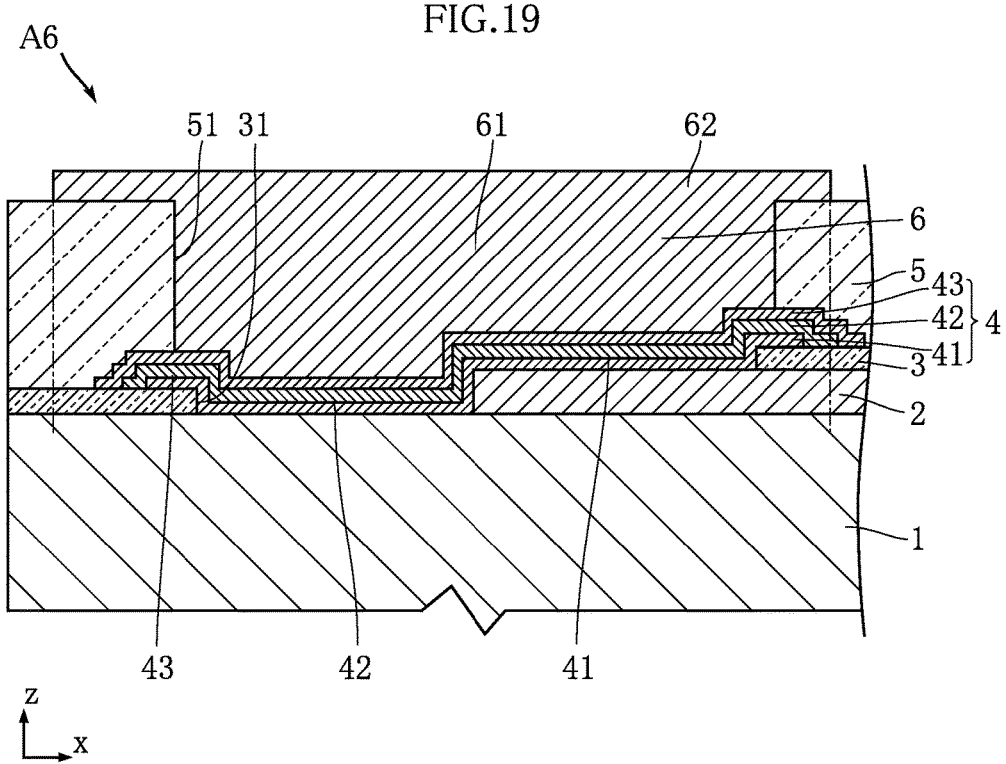
FIG. 19 is an enlarged cross-sectional view of a magnetoelectric converting element according to a sixth embodiment of the present disclosure.

FIG. 19 shows a magnetoelectric converting element A6 according to a sixth embodiment of the present disclosure. The magnetoelectric converting element A6 of this embodiment is similar to the magnetoelectric converting element A3 described above, other than the relation between the first openings 31 and the second openings 51.

In the present embodiment, the second openings 51 are located outside of the first openings 31 as viewed in the z direction, while the boundaries between the second openings 51 in the second insulating layer 5 and the terminal conductors 6 overlap with the erosion-resistant layers 43. Thus, this embodiment can also improve the magnetic field sensitivity of the magnetoelectric converting element A6 by preventing the ingress of moisture or Sn through the above-noted boundaries.

The present disclosure is not limited to the specific magnetoelectric converting element and magnetoelectric converting modules according to the embodiments described above. Various design modifications may be made with respect to the configurations of components and elements of the magnetoelectric converting element and magnetoelectric converting modules according to the present disclosure.

The following clauses describe technical features of the present disclosure.

[Clause 1]

A magnetoelectric converting element comprising:

a substrate;

a magnetosensitive layer formed on the substrate;

a first insulating layer having a first opening exposing a part of the magnetosensitive layer;

an underlying conductive layer formed on the exposed part of the magnetosensitive layer;

a second insulating layer having a second opening exposing a part of the underlying conductive layer; and a terminal conductor formed on the exposed part of the underlying conductive layer, wherein the underlying conductive layer includes an uppermost erosion-resistant layer overlapping with a boundary between the second opening of the second insulating layer and the terminal conductor in plan view.

[Clause 2]

The magnetoelectric converting element according to clause 1, wherein the erosion-resistant layer includes a main layer that contains at least one of Ni, Ru, Ta or Cu.

[Clause 3]

The magnetoelectric converting element according to clause 2, wherein the erosion-resistant layer includes a plating promoting layer formed on the main layer.

[Clause 4]

The magnetoelectric converting element according to clause 3, wherein the promoting layer is made of Au.

[Clause 5]

The magnetoelectric converting element according to any one of clauses 1 to 4, wherein the underlying conductive layer includes an ohmic contact layer in contact with the magnetosensitive layer.

[Clause 6]

The magnetoelectric converting element according to clause 5, wherein the ohmic contact layer has a portion containing Au, Ge and Ni.

[Clause 7]

The magnetoelectric converting element according to clause 6, wherein the ohmic contact layer has a first portion covering the first insulating layer and a second portion covering the magnetosensitive layer, and the first portion has a higher Ge and Ni content than the second portion.

[Clause 8]

The magnetoelectric converting element according to clause 7, wherein the magnetosensitive layer has a portion in contact with the ohmic contact layer, and this portion has a diffusion of Ge and Ni.

[Clause 9]

The magnetoelectric converting element according to any one of clauses 5 to 8, wherein the underlying conductive layer includes an intermediate layer between the ohmic contact layer and the erosion-resistant layer.

[Clause 10]

The magnetoelectric converting element according to clause 9, wherein the intermediate layer includes a main layer in contact with the erosion-resistant layer.

[Clause 11]

The magneto electric converting element according to clause 10, wherein the main layer is made of Au.

[Clause 12]

The magneto electric converting element according to clause 10 or 11, wherein the intermediate layer includes a barrier layer in contact with the ohmic contact layer.

[Clause 13]

The magneto electric converting element according to clause 12, wherein the barrier layer is made of Ti.

The invention claimed is:

1. A magnetoelectric converting element comprising:
a substrate;
a magnetosensitive layer formed on/over the substrate;
a first insulating layer having a first opening exposing a part of the magnetosensitive layer;
an underlying conductive layer formed on/over the part of the magnetosensitive layer;
a second insulating layer having a second opening exposing a part of the underlying conductive layer; and
a terminal conductor formed on/over the part of the underlying conductive layer,
wherein the second opening is located inside the first opening in plan view, and
wherein an entirety of the terminal conductor is contained within the first opening when viewed in plan.

2. The magnetoelectric converting element according to claim 1, wherein the terminal conductor includes a filing part that fills the second opening and a projecting part that extends beyond the second opening in plan view.

3. The magnetoelectric converting element according to claim 2, wherein the first opening exposes a part of the substrate.

4. The magnetoelectric converting element according to claim 3, wherein the underlying conductive layer is formed on/over the part of the substrate that is exposed in the first opening.

5. The magnetoelectric converting element according to claim 4, wherein the underlying conductive layer covers an entirety of the exposed part of the substrate and an entirety of the exposed part of the magnetosensitive layer.

6. The magnetoelectric converting element according to claim 5, wherein the underlying conductive layer is larger than the first opening in plan view.

7. The magnetoelectric converting element according to claim 6, wherein the underlying conductive layer is larger than the terminal conductor in plan view.

8. The magnetoelectric converting element according to claim 1, wherein the second insulating layer is thicker than the first insulating layer.

9. The magnetoelectric converting element according to claim 1, wherein the second insulating layer contains SiN, $SiO_2$, SiON, a polyimide resin or a phenolic resin.

10. The magnetoelectric converting element according to claim 1, wherein the substrate comprises a semi-insulating compound semiconductor substrate.

11. The magnetoelectric converting element according to claim 10, wherein the magnetosensitive layer contains a compound semiconductor doped with an n-type impurity.

12. The magnetoelectric converting element according to claim 11, wherein the magnetosensitive layer contains GaAs, InSb or InAs as the compound semiconductor.

13. The magnetoelectric converting element according to claim 12, wherein the magnetosensitive layer contains Si as the n-type impurity.

14. The magnetoelectric converting element according to claim 1, wherein the first insulating layer contains SiN, $SiO_2$ or SiON.

15. The magnetoelectric converting element according to claim 1, wherein the underlying conductive layer contains Au.

16. The magnetoelectric converting element according to claim 1, wherein the terminal conductor contains Ni.

17. The magnetoelectric converting element according to claim 16, wherein the terminal conductor contains Pd and Au.

18. A magnetoelectric converting module comprising:
a magnetoelectric converting element according to claim 1;
a module substrate having an obverse surface and a cavity in the obverse surface, the cavity accommodating the magnetoelectric converting element;
a module wiring layer formed on/over the module substrate;
a conductive joint layer that joins the terminal conductor of the magnetoelectric converting element to the module wiring layer; and
a sealing resin that fills the cavity and surrounds the magnetoelectric converting element.

19. The magnetoelectric converting module according to claim 18, wherein the sealing resin is present between a bottom of the cavity and the magnetoelectric converting element.

20. The magnetoelectric converting module according to claim 18, wherein the module substrate is made of a single crystal of a semiconductor material.

21. The magnetoelectric converting module according to claim 20, wherein the semiconductor material comprises Si.

22. The magnetoelectric converting module according to claim 21, wherein the obverse surface is flat and perpendicular to a thickness direction of the module substrate.

23. The magnetoelectric converting module according to claim 22, wherein the obverse surface comprises a (100) crystal plane.

24. A magnetoelectric converting element, comprising:
a substrate;
a magnetosensitive layer formed on the substrate;
a first insulating layer having a first opening exposing a part of the magnetosensitive layer;
an underlying conductive layer formed on the part of the magnetosensitive layer;
a second insulating layer having a second opening exposing a part of the underlying conductive layer; and
a terminal conductor formed on the part of the underlying conductive layer,
wherein the second opening is located inside the first opening in plan view, and
wherein the second insulating layer includes a soft layer made of a softer material than the first insulating layer.

25. The magnetoelectric converting element according to claim 24, wherein the second insulating layer includes a hard layer made of a harder material than the soft layer, the soft layer being located between the hard layer and the first insulating layer.

26. The magnetoelectric converting element according to claim 25, wherein the soft layer and the hard layer have inner edges defining the second opening, the inner edges coinciding with each other in plan view.

27. The magnetoelectric converting element according to claim 25, wherein the soft layer is thinner than the hard layer.

28. The magnetoelectric converting element according to claim 27, wherein the hard layer and the first insulating layer are made of a same material.

29. The magnetoelectric converting element according to claim 24, the hard layer contains SiN, $SiO_2$ or SiON.

30. The magnetoelectric converting element according to claim 29, wherein the soft layer contains polyimide resin or polyimide resin.

31. A magnetoelectric converting element, comprising:
a substrate;
a magnetosensitive layer formed on the substrate;
a first insulating layer having a first opening exposing a part of the magnetosensitive layer;
an underlying conductive layer formed on the part of the magnetosensitive layer;
a second insulating layer having a second opening exposing a part of the underlying conductive layer; and
a terminal conductor formed on the part of the underlying conductive layer,
wherein the second opening is located inside the first opening in plan view, and
wherein the underlying conductive layer includes an erosion-resistant layer as an uppermost layer of the underlying conductive layer, the erosion-resistant layer overlapping with a boundary between the second opening in the second insulating layer and the terminal conductor in plan view.

32. A magnetoelectric converting module, comprising:
a magnetoelectric converting element comprising:
a substrate;
a magnetosensitive layer formed on the substrate;
a first insulating layer having a first opening exposing a part of the magnetosensitive layer;
an underlying conductive layer formed on the part of the magnetosensitive layer;
a second insulating layer having a second opening exposing a part of the underlying conductive layer; and
a terminal conductor formed on the part of the underlying conductive layer,
wherein the second opening is located inside the first opening in plan view,;
a module substrate having an obverse surface and a cavity in the obverse surface, the cavity accommodating the magnetoelectric converting element;
a module wiring layer formed on the module substrate;
a conductive joint layer that joins the terminal conductor of the magnetoelectric converting element to the module wiring layer; and
a sealing resin that fills the cavity and surrounds the magnetoelectric converting element,
wherein the sealing resin is present between a bottom of the cavity and the magnetoelectric converting element, and
wherein the sealing resin has a coefficient of linear expansion that is lower than that of the terminal conductor for a temperature equal to or lower than a transition point of the sealing resin, and the coefficient of linear expansion is higher than that of the terminal conductor for a temperature higher than the transition point.

* * * * *